(12) United States Patent
Shigyo (10) Patent No.: US 6,222,224 B1
(45) Date of Patent: Apr. 24, 2001

(54) ERASABLE AND PROGRAMMABLE NONVOLATILE SEMICONDUCTOR MEMORY, SEMICONDUCTOR INTEGRATED CIRCUIT DEVICE HAVING THE SEMICONDUCTOR MEMORY AND METHOD OF MANUFACTURING THE SEMICONDUCTOR MEMORY

(75) Inventor: Naoyuki Shigyo, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 08/994,482

(22) Filed: Dec. 19, 1997

(30) Foreign Application Priority Data

Dec. 27, 1996 (JP) .................................... 8-351629

(51) Int. Cl.$^7$ .................................... H01L 29/788
(52) U.S. Cl. .................... 257/315; 257/321; 257/402; 257/515
(58) Field of Search .................... 257/403, 492, 257/316, 315, 321, 402, 515; 438/201, 211, 257, 263, 264

(56) References Cited

U.S. PATENT DOCUMENTS

| | | | |
|---|---|---|---|
| 3,814,992 | * | 6/1974 | Kump et al. .................... 257/403 |
| 3,891,468 | * | 6/1975 | Ito et al. .................... 438/291 |
| 4,115,914 | * | 9/1978 | Harari .................... 438/157 |
| 4,841,346 | * | 6/1989 | Noguchi .................... 257/403 |
| 4,990,974 | * | 2/1991 | Vinal .................... 257/403 |
| 5,151,759 | * | 9/1992 | Vinal .................... 257/348 |
| 5,677,876 | * | 10/1997 | Tanaka .................... 365/185.28 |
| 5,698,879 | * | 12/1997 | Aritome et al. .................... 257/315 |

* cited by examiner

Primary Examiner—Eddie C. Lee
Assistant Examiner—George C. Eckert, II
(74) Attorney, Agent, or Firm—Foley & Lardner

(57) ABSTRACT

A nonvolatile semiconductor memory has memory cells (1) each having an insulated-gate FET that has an information storage part. A semiconductor region (27) is formed at the surface of a channel region of each memory cell. The semiconductor region has the same conductivity type as a channel conductivity type and functions to decrease the strength of an electric field at the surface of the channel region. If the insulated-gate FET is of an n-channel type, the semiconductor region is of an n-type. The semiconductor region suppresses threshold voltage variations among the insulated-gate FETs of the memory cells and prevents soft-writing in the memory cells.

22 Claims, 12 Drawing Sheets

ERASABLE AND PROGRAMMABLE NONVOLATILE SEMICONDUCTOR MEMORY, SEMICONDUCTOR INTEGRATED CIRCUIT DEVICE HAVING THE SEMICONDUCTOR MEMORY AND METHOD OF MANUFACTURING THE SEMICONDUCTOR MEMORY

BACKGROUND OF THE INVENTION

1. Field of the Invention

The present invention relates to an erasable and programmable nonvolatile semiconductor memory, semiconductor integrated circuit device having the semiconductor memory and method of manufacturing the semiconductor memory. In particular, the present invention relates to an EEPROM (electrically erasable and programmable read-only memory) capable of suppressing threshold-voltage variations among memory cells and preventing soft-writing (erroneous writing) in memory cells, semiconductor integrated circuit device having the EEPROM and a method of manufacturing such an EEPROM.

2. Description of the Prior Art

Semiconductor memories are roughly classified into RAMs (random-access memories) and ROMs (read-only memories). The RAMs allow to rewrite information stored therein at any time. The ROMs allow to write information into them during manufacturing or after manufacturing, and the information once written therein is completely unable to rewrite or is difficult to rewrite. Generally, the RAMs are volatile memories that hold information only with the supply of electric power, and the ROMs are nonvolatile memories that hold information even without power supply.

The ROMs include masked ROMs, EPROMs (erasable and programmable read-only memories), EEPROMs, etc. The EEPROMs are one of the promising semiconductor memories because they are electrically erasable and programmable by the user. Among the EEPROMs, NAND-type EEPROMs have a possibility of replacing magnetic disks because they may have very small memory cells to realize high integration and large capacity.

However, the NAND-type EEPROMs have some problems.

Memory cells of the EEPROM are made of insulated-gate FETs (field effect transistors), and the threshold voltages of these FETs vary from one to another due to variations in the thicknesses of gate insulation films and variations in the concentrations of impurities in channel regions. These variations are produced during the manufacturing of the EEPROM. The threshold-voltage variations reduce a margin in determining whether information read out of a given cell is "0" or "1" and may cause a read error.

The EEPROMs frequently employ a trench structure as an element isolating region between memory cells, to realize high integration and large capacity. The trench structure is composed of a trench formed from the surface of a substrate in the depth direction and insulating material filled in the trench. In a read operation of an insulated-gate FET serving as a memory cell, a read voltage is applied to a control gate electrode of the FET. The read voltage may cause an electric field concentration at a corner of the trench that defines the width of a channel region. During the read operation, the electric field concentration gradually accumulates a charge by injecting electrons from the channel region into a floating gate electrode through a tunnel insulation film, thereby causing soft-writing (erroneous writing).

SUMMARY OF THE INVENTION

To solve these problems, an object of the present invention is to provide a nonvolatile semiconductor memory capable of reducing variations in the threshold voltages of insulated-gate FETs that form memory cells of the memory, causing no error in reading information out of the memory, and being highly reliable.

Another object of the present invention is to provide a nonvolatile semiconductor memory capable of causing no soft-writing nor a read error in reading information out of the memory and being highly reliable.

Still another object of the present invention is to provide a method of manufacturing such a nonvolatile semiconductor memory.

Further, object of the present invention is to provide a semiconductor integrated circuit device to have a nonvolatile semiconductor memory.

In order to accomplish the objects, the present invention provides a nonvolatile semiconductor memory having memory cells each having an insulated-gate FET that stores information in an information storage part according to a charge injected from a channel region into the information storage part through a tunnel insulation film. The memory is characterized by a semiconductor region formed at the surface of the channel region of the insulated-gate FET. The semiconductor region has the same conductivity type as a channel conductivity type and functions to reduce the strength of an electric field at the surface of the channel region.

The concentration of impurities in the semiconductor region has a peak at the surface of the channel region. The semiconductor region makes zero of the effective strength of an electric field at the surface of the channel region in an information read operation of the memory cell. A space charge in the semiconductor region is set to be equal to that in a well region or a semiconductor substrate where the insulated-gate FET is formed. The space charge in the well region or semiconductor substrate is determined by an electron charge quantity, the concentration of impurities in the well region or semiconductor substrate, and the maximum width of a depletion layer in the well region or semiconductor substrate. The space charge in the semiconductor region is determined by an electron charge quantity, the concentration of impurities in the semiconductor region, and the maximum width of a depletion layer in the semiconductor region. The diffusion depth of the semiconductor region is set to be equal to the maximum width of the depletion layer that determines the space charge in the semiconductor region.

The insulated-gate FET includes floating gate electrode and a control gate electrode, and the floating gate electrode serves as the information storage part. It is preferable that the insulated-gate FET is of an n-channel type and the semiconductor region is of an n-type. The n-type semiconductor region has a lower impurity concentration than the source and drain regions of the insulated-gate FET.

The memory cells may electrically be connected in series to form a NAND-type EEPROM. The channel region of the insulated-gate FET is formed at the surface of a silicon semiconductor substrate. The information storage part, i.e., the floating gate electrode is made of gate electrode material that has a Fermi level at substantially the center of a band gap of the silicon semiconductor substrate. The gate electrode material may be refractory metal such as W, Ti, Mo, and Co, or silicide that is a compound of refractory metal and silicon. The present invention also provides a multivalued nonvolatile semiconductor memory having memory cells each storing any one of at least two values. Further the present invention also provides a semiconductor integrated circuit device having a nonvolatile semiconductor memory.

The semiconductor region of the nonvolatile semiconductor memory of the present invention reduces the strength of an electric field at the surface of the channel region, to suppress variations in the threshold voltages of the memory cells even if the insulated-gate FETs serving as the memory cells involve variations in the thicknesses of the tunnel insulation films (gate insulation films) and variations in the concentrations of impurities in the channel regions. Even if the concentration of impurities at the surface of the semiconductor substrate of the insulated-gate FETs varies from cell to cell, no variations occur in the threshold voltages of the cells. This results in improving a margin in testing read information, preventing a read error, and improving the reliability of the memory.

The nonvolatile semiconductor memory of the present invention may have an element isolation region made of a trench formed from the surface of the channel region in the depth direction and insulating material filled in the trench. The semiconductor region reduces the strength of the electric field at the surface of the channel region, and at the same time, relaxes electric field concentration in the channel region at a corner of the trench.

The semiconductor region of the nonvolatile semiconductor memory having the trench structure not only reduces the strength of an electric field at the surface of the channel region but also suppresses electric field concentration at a corner of the trench, thereby preventing soft-writing in an information read operation. This results in further improving the reliability of the nonvolatile semiconductor memory to realize higher integration and larger capacity.

The present invention also provides a method of manufacturing such a nonvolatile semiconductor memory, having the steps of forming an element forming region and an element isolation region at the surface of a semiconductor substrate and forming a semiconductor region at the surface of a channel region of an insulated-gate FET of a memory cell in the element forming region. The semiconductor region has the same conductivity type as a channel conductivity type and functions to reduce the strength of an electric field at the surface of the channel region. The method further has the step of sequentially forming a tunnel insulation film and an information storage part on the surface of the channel region. The step of forming the element isolation region preferably includes the steps of forming a trench from the surface of the semiconductor substrate in the depth direction and filling the trench with insulating material.

This manufacturing method easily manufactures the nonvolatile semiconductor memory having the effects mentioned above.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENT

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 2:
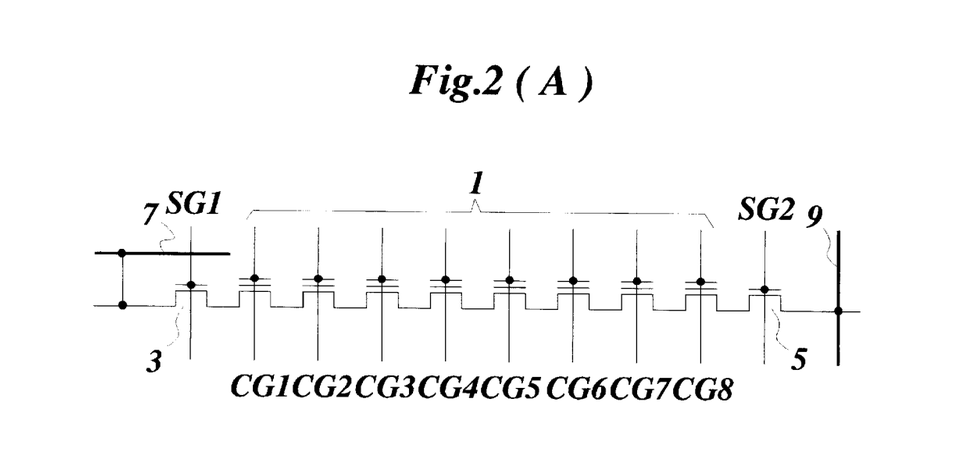
FIG. 2(A) shows an equivalent circuit of memory cells of a NAND-type EEPROM according to the present invention.
FIG. 2(B) is a plan view showing the memory cells of the NAND-type EEPROM.

FIG. 2(A) shows an equivalent circuit of a NAND-type EEPROM according to an embodiment of the present invention, and FIG. 2(B) is a plan view showing the EEPROM. The EEPROM has memory cells 1 each having an insulated-gate FET having an information storage part for storing one bit of information. Although the embodiment arranges the memory cells 1 of eight bits in series, the number of memory cells or bits is optional. Among the eight memory cells 1, the adjacent insulated-gate FETs share a source or drain region, and the eight memory cells 1 are electrically connected in series. In the embodiment, the insulated-gate FET is of an n-channel type to realize a high-speed operation.

Among the series-connected memory cells 1, one at one end is connected to a bit line 7 through a selector MISFET (metal insulator semiconductor FET) 3, and one at the other end is connected to a source line 9 through a selector MISFET 5. The bit line 7 is connected to the selector MISFET 3 for every 16 memory cells 1, and the source line 9 is connected to the selector MISFET 5 also for every 16 memory cells 1.

In the NAND-type EEPROM, the memory cells 1 are connected in series so that the adjacent memory cells share a source or drain region, and the bit line 7 and source line 9 involve a smaller number of contacts, to reduce the area of each memory cell 1.

The basic operation of the NAND-type EEPROM of FIGS. 2(A) and 2(B) will be explained.

Figure 3:
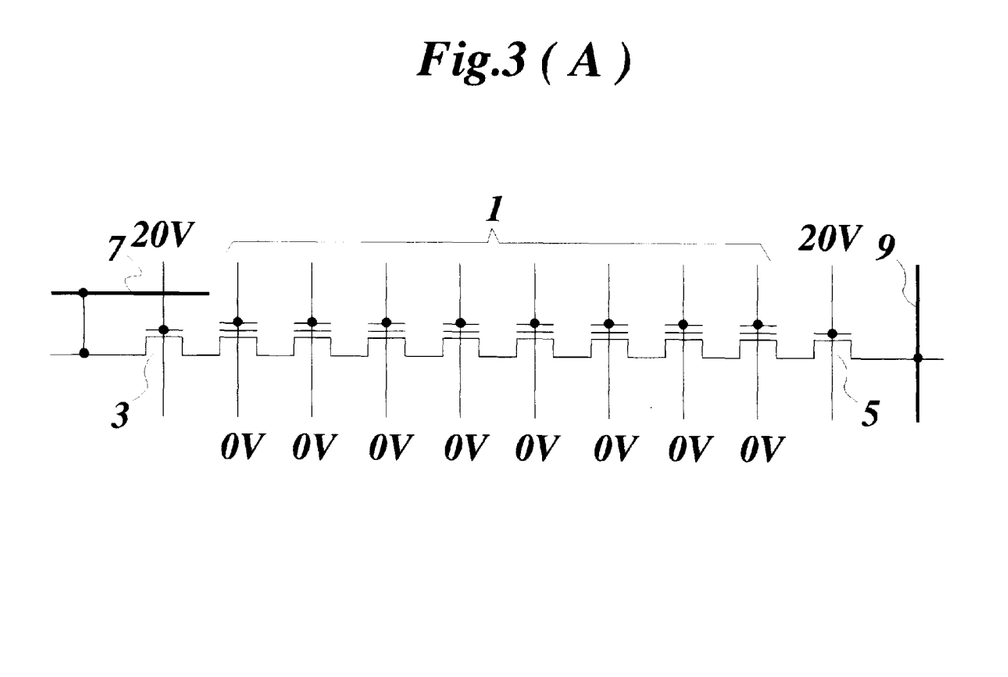
FIG. 3(A) shows an information erase operation of the NAND-type EEPROM.
FIG. 3(B) is a sectional view showing one memory cell in the information erase operation.

An information erase operation will be explained. In FIG. 3(A), a voltage of 0 V is applied to the control gate electrode of every memory cell 1, and a high erase voltage of about 20 V is applied to a p-type well region and an n-type semiconductor substrate. The p-type well region accommodates the memory cells 1 and selector MISFETs 3 and 5. The p-type well region is formed in the n-type semiconductor substrate. The erase voltage of about 20 V is applied to the gate electrodes of the selector MISFETs 3 and 5. The bit line 7 and source line 9 are kept in a floating state. As a result, as shown in FIG. 3(B), electrons accumulated in a floating gate electrode 11 of each memory cell 1 pass through a tunnel insulation film (a gate insulation film) into the p-type well region. Then, every memory cell 1 is set to a depletion-type threshold voltage. In FIG. 3(B), numeral 13 is a control gate electrode, 15 and 17 are the source and drain regions, and 19 is the p-type well region (or the p-type semiconductor substrate).

Figure 4:
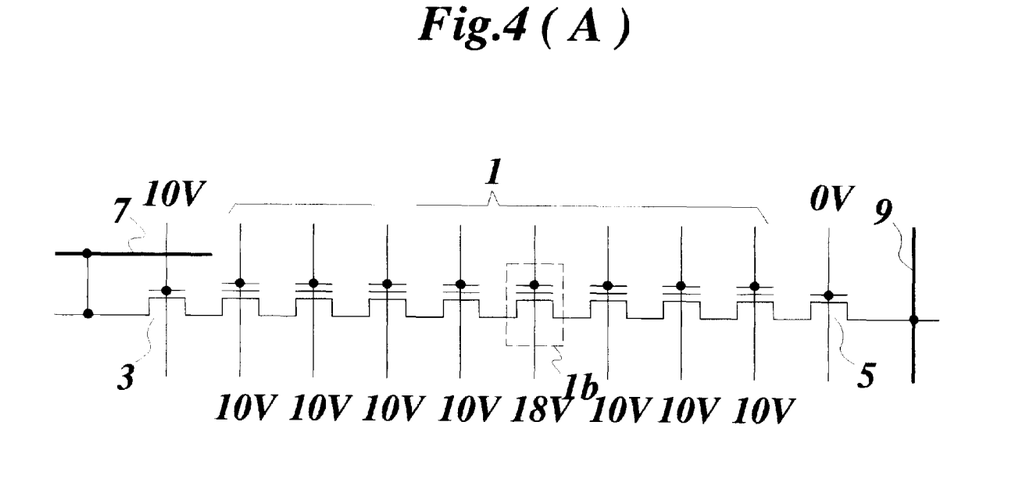
FIG. 4(A) shows an information write operation of the NAND-type EEPROM.
FIG. 4(B) is a sectional view showing one memory cell in the information write operation.

An information write operation will be explained. In FIG. 4(A), information is going to be written into a memory cell 1b. A write voltage of about 18 V is applied to the control gate electrode of the memory cell 1b, and an intermediate voltage of about 10 V is applied to the control gate electrodes of the other memory cells 1. The gate electrode of the selector MISFET 5 receives 0 V, and the gate electrode of the selector MISFET 3 receives the intermediate voltage of about 10 V. When a voltage of 0 V is applied to the bit line 7, electrons are injected from the p-type well region 19 into the floating gate electrode 11 of the memory cell 1b through the tunnel insulation film as shown in FIG. 4(B), so that the memory cell 1b is set to an enhancement-type threshold voltage. Namely, information "0" is stored in the memory cell 1b. When a voltage of about 7 V is applied to the bit line 7, the potential difference between the channel region and the control gate electrode 13 of the memory cell 1b is about 11V, which is insufficient to create an F-N (Fowlor-Nordheim) current through the tunnel insulation film. Eventually, the memory cell 1b is kept at the depletion-type threshold voltage, and information "1" is held in the memory cell 1b.

Figure 5:
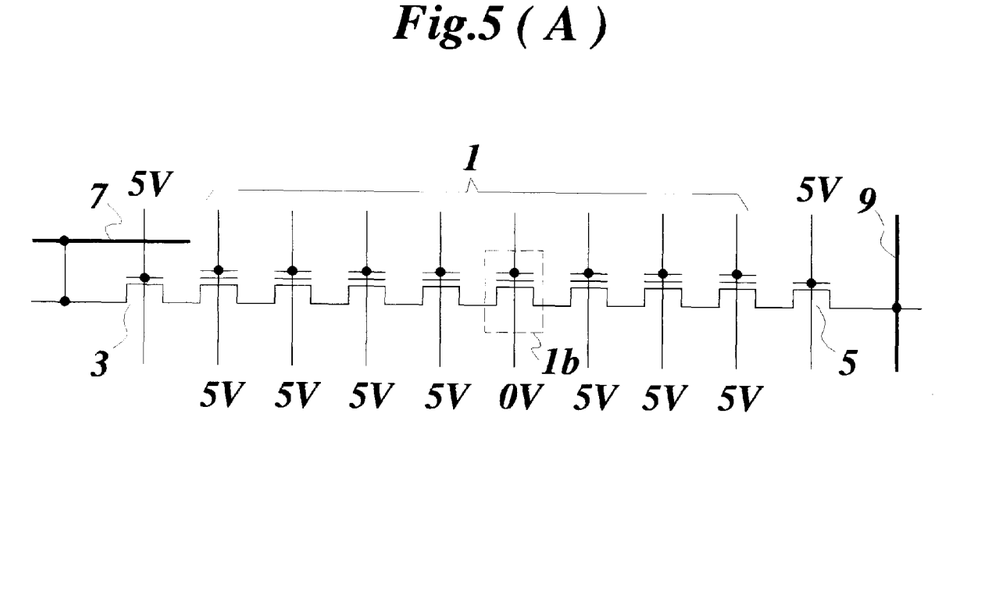
FIG. 5(A) shows an information read operation of the NAND-type EEPROM.
FIG. 5(B) is a characteristic curve showing a relationship between a drain current and a gate voltage in the information read operation.

An information read operation will be explained. In FIG. 5(A), information stored in the memory cell 1b is going to be read. A voltage of 0 V is applied only to the control gate electrode of the memory cell 1b, and a read voltage of, for example, 5 V is applied to the gate electrodes of the other memory cells 1. At the same time, the read voltage of 5 V is applied to the gate electrodes of the selector MISFETs 3 and 5. The read voltage of 5 V is applied to the bit line 7 and a voltage of 0 V to the source line 9. As a result, the memory cells 1 except the memory cell 1b, and the selector MISFETs 3 and 5 simply work as transfer gates. In FIG. 5(B), the control gate electrode of the memory cell 1b receives 0 V, and if the memory cell 1b holds information "0," the memory cell 1b has a positive enhancement-type threshold voltage to pass no current. If the memory cell 1b holds information "1," the memory cell 1b has a negative depletion-type threshold voltage to pass a current. In this way, a current flows or not through the memory cell 1b depending on information "0" or "1" stored therein. This current change passes through the bit line 7 and is detected by a sense amplifier (not shown) connected to the bit line 7. Then, information "0" or "1" is read.

Figure 1:
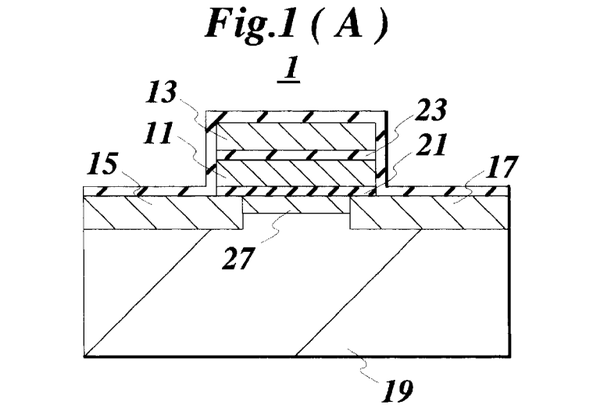
FIG. 1(A) is a sectional view showing a memory cell of an EEPROM according to an embodiment of the present invention.
FIG. 1(B) is another sectional view showing the memory cell of FIG. 1(A)
FIG. 1(C) is a graph showing an impurity distribution in a semiconductor region in the memory cell of FIG. 1(A)

The structure of one of the memory cells 1 of the NAND-type EEPROM will be explained. FIG. 1(A) is a sectional view taken along the length of a channel of the memory cell, and FIG. 1(B) is a sectional view across the channel of the memory cell.

The memory cell 1 is an n-channel insulated-gate FET having an information storage part. The insulated-gate FET has, at the surface of the p-type well region 19, a channel region, a tunnel insulation film (a first gate insulation film) 21, a floating gate electrode 11, a gate insulation film (a second gate insulation film) 23, a control gate electrode 13, and a pair of n-type semiconductor regions 15 and 17 serving as source and drain regions. The floating gate electrode 11 serves as the information storage part. To improve an information holding characteristic, the floating gate electrode 11 is enclosed with insulation films such as the tunnel insulation film 21 and gate insulation film 23. The floating gate electrode 11 is arranged between the channel region and the control gate electrode 13. When an F-N current flows through the tunnel insulation film 21 to inject electrons from the channel region into the floating gate electrode 11, the floating gate 11 semipermanently holds the injected electrons.

Basically, the memory cell 1 passes or not a current through the channel region in response to a voltage applied to the control gate electrode 13 thereof. If the floating gate electrode 11 holds injected electrons, the memory cell 1 has an enhancement-type threshold voltage. If the floating gate electrode 11 holds no injected electrons, the memory cell 1 has a depletion-type threshold voltage.

The tunnel insulation film 21 is a silicon oxide film formed by thermal oxidation that is capable of providing a very thin quality film. The gate insulation film 23 is an ONO (oxide/nitride/oxide) film made of a sequential lamination of a silicon oxide film, a silicon nitride film, and a silicon oxide film, to increase coupled capacitance between the channel region and the control gate electrode 13 and improve a dielectric withstand voltage.

Each memory cell 1 of the NAND-type EEPROM of the embodiment is characterized by an n-type semiconductor region 27 formed at the surface of the channel region of the insulated-gate FET as shown in FIGS. 1(A) and 1(B). The n-type semiconductor region 27 has a peak in the impurity concentration thereof at an interface between the p-type well region 19 and the tunnel insulation film 21 as shown in FIG. 1(C). The semiconductor region 27 has the same conductivity type as the channel region and functions to reduce (or preferably zero) the strength of an electric field at the surface of the channel region. The semiconductor region 27 of each memory cell 1 reduces variations among the threshold voltages of the memory cells in an information read operation, and if each memory cell employs a trench structure as an element isolation region, prevents soft-writing.

The functions of the n-type semiconductor region 27 of the present invention will be explained in detail.

Generally, a threshold voltage $V_{th}$ of an insulated-gate FET is expressed as follows:

$$V_{th}=V_{fb}+\varnothing_s+t_{ox}\cdot E_{ox} \qquad (1)$$

where $V_{fb}$ is a flat band voltage, $\varnothing_s$ is a surface potential, $t_{ox}$ is the thickness of the tunnel insulation film, and $E_{ox}$ is an electric field strength applied to the tunnel insulation film. There are mainly two causes that fluctuate the threshold voltage $V_{th}$ of the expression (1).

(A) When the thickness of the tunnel insulation film is uneven due to fluctuations in manufacturing conditions.

(B) When the concentration of impurities in the p-type well region (or semiconductor substrate) varies from memory cell to memory cell, to fluctuate an electric field strength applied to the tunnel insulation film of each memory cell.

As is apparent in the expression (1), reducing, ideally zeroing the electric field strength $E_{ox}$ may solve the causes (A) and (B) that fluctuate the threshold voltage $V_{th}$. Namely, the smaller the electric field strength $E_{ox}$, the smaller the influence of variations in the thickness $t_{ox}$ of the tunnel insulation film on the threshold voltage $V_{th}$. The smaller the electric field strength $E_{ox}$, the smaller the variations in the electric field strength $E_{ox}$ itself even if the concentration of impurities in the p-type well region varies from memory cell to memory cell. The n-type semiconductor region 27 shown in FIGS. 1(A) and 1(B) functions to reduce, ideally zero the electric field strength $E_{ox}$.

Calculations of the impurity concentration and diffusion layer width (depth) of the n-type semiconductor region 27 will be explained. These calculations are based on an insulated-gate FET having an ideal structure. In practice, the calculations must be adjusted according to processing conditions of insulated-gate FETs.

The n-type semiconductor region 27 is usually formed by implanting n-type impurity ions into the surface of the p-type well region (or semiconductor substrate) according to an ion implantation technique. The n-type of the impurities is opposite to the conductivity type of the p-type well region. Generally, the electric field strength $E_{ox}$ applied to the tunnel insulation film 21 is expressed according to Gauss' theorem as follows:

$$E_{ox}=Q_{bulk}/\epsilon_{ox} \quad (2)$$

where $Q_{bulk}$ is a charge in the p-type well region, more precisely, a charge in a depletion layer, and $\epsilon_{ox}$ is a dielectric constant of the tunnel insulation film. The n-type semiconductor region 27 of the embodiment changes the expression (2) as follows:

$$E_{ox}=(Q_{bulk}-Q_{buried})/\epsilon_{ox} \quad (3)$$

where $Q_{buried}$ is a charge in the n-type semiconductor region 27. The charge $Q_{bulk}$ of the p-type well region is expressed as follows:

$$Q_{bulk}=q \cdot N_A \cdot x_{bulk} \quad (4)$$

where q is an electron charge quantity, $N_A$ is an impurity concentration of the p-type well region, and $x_{bulk}$ is a maximum depletion layer width in the p-type well region.

The charge $Q_{buried}$ of the n-type semiconductor region 27 is expressed as follows:

$$Q_{buried}=q \cdot N_D \cdot x_{buried} \quad (5)$$

where $N_D$ is an impurity concentration of the semiconductor region 27 and $x_{buried}$ is a maximum depletion layer width in the semiconductor region 27.

To minimize, ideally zero the electric field strength $E_{ox}$, the impurity concentration $N_D$ and maximum depletion layer width $x_{buried}$ of the semiconductor region 27 must satisfy the following expression:

$$Q_{bulk}=Q_{buried} \quad (6)$$

Since a space charge is present only in a depletion layer, the diffusion layer width of the semiconductor region 27 is sufficient if it is equal to the maximum depletion layer width $x_{buried}$. Consequently, the diffusion layer width of the semiconductor region 27 is calculable.

The maximum depletion layer widths $x_{bulk}$ and $x_{buried}$ are calculated according to the expression (6) as follows:

$$xbulk=(2\epsilon_{si}N_D \cdot kT \cdot ln(N_A \cdot N_D/ni^2)/(q^2 \cdot N_A(N_A+N_D)))^{0.5} \quad (7)$$

$$xburied=(2\epsilon_{si}N_A \cdot kT \cdot ln(N_A \cdot N_D/ni^2)/(q^2 \cdot N_D(N_A+N_D)))^{0.5} \quad (8)$$

where $\epsilon_{si}$ is a dielectric constant of silicon (Si) and ni is an intrinsic carrier concentration of silicon.

With the expressions (4), (5), (6), (7), and (8), it is theoretically possible to calculate the impurity concentration and diffusion layer width of the n-type semiconductor region 27. As mentioned above, an actual insulated-gate FET is provided with, in addition to the semiconductor region 27 of the embodiment, impurities at the surface of the p-type well region by ion implantation, etc., to adjust, for example, a threshold voltage. Results of the above-mentioned calculations, therefore, are not always correct.

Figure 6:
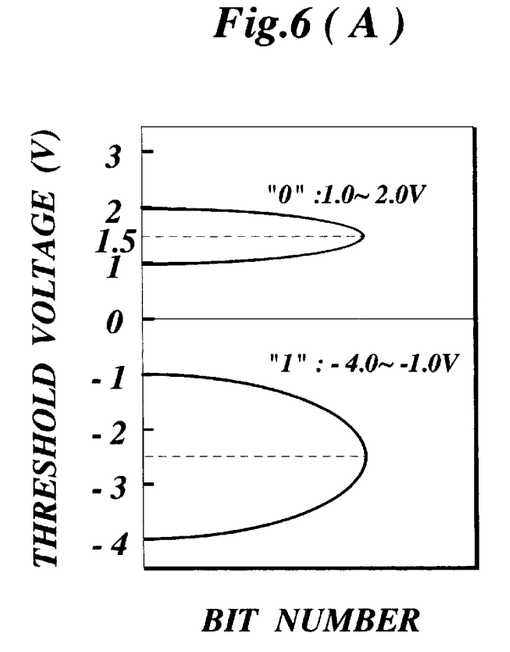
FIG. 6(A) shows variations in threshold voltages.
FIG. 6(B) shows variations in threshold voltages in a multivalued memory cell.

In this way, the NAND-type EEPROM of the embodiment has the n-type semiconductor region 27 whose impurity concentration and diffusion layer width are selected according to the calculations mentioned above, to greatly reduce the strength of an electric field applied to the tunnel insulation film 21 at the surface of the channel region. As shown in FIG. 6(A), the insulated-gate FET having the semiconductor region 27 is not affected by variations in the thickness of the tunnel insulation film 21 and variations in impurity concentrations, to thereby stabilize the threshold voltage of the memory cell 1. More precisely, an enhancement-type threshold voltage of any memory cell 1 storing information "0" only varies in the narrow range of plus and minus 0.5 V around 1.5 V. This threshold voltage is stable. On the other hand, a depletion-type threshold voltage of any memory cell 1 storing information "1" only varies in the narrow range of plus and minus 1.5 V around −2.5 V. This threshold voltage is stable. The NAND-type EEPROM of this embodiment has the enhancement-type and depletion-type threshold voltages that may vary within about 2 V. Since a boundary between the enhancement- type and depletion-type threshold voltages is clear, information "0" and information "1" are surely distinguished from each other.

The present invention suppresses variations in the threshold voltages of memory cells, and therefore, is applicable to multivalued NAND-type EEPROMs that store one of at least two values in each memory cell. FIG. 6(B) shows an example of the multivalued NAND-type EEPROMs. Each memory cell of the example is capable of storing one of information pieces of "00," "01," "10," and "11." Each of threshold voltages for these information pieces is suppressed to vary only within plus and minus 1 V.

Figure 7:
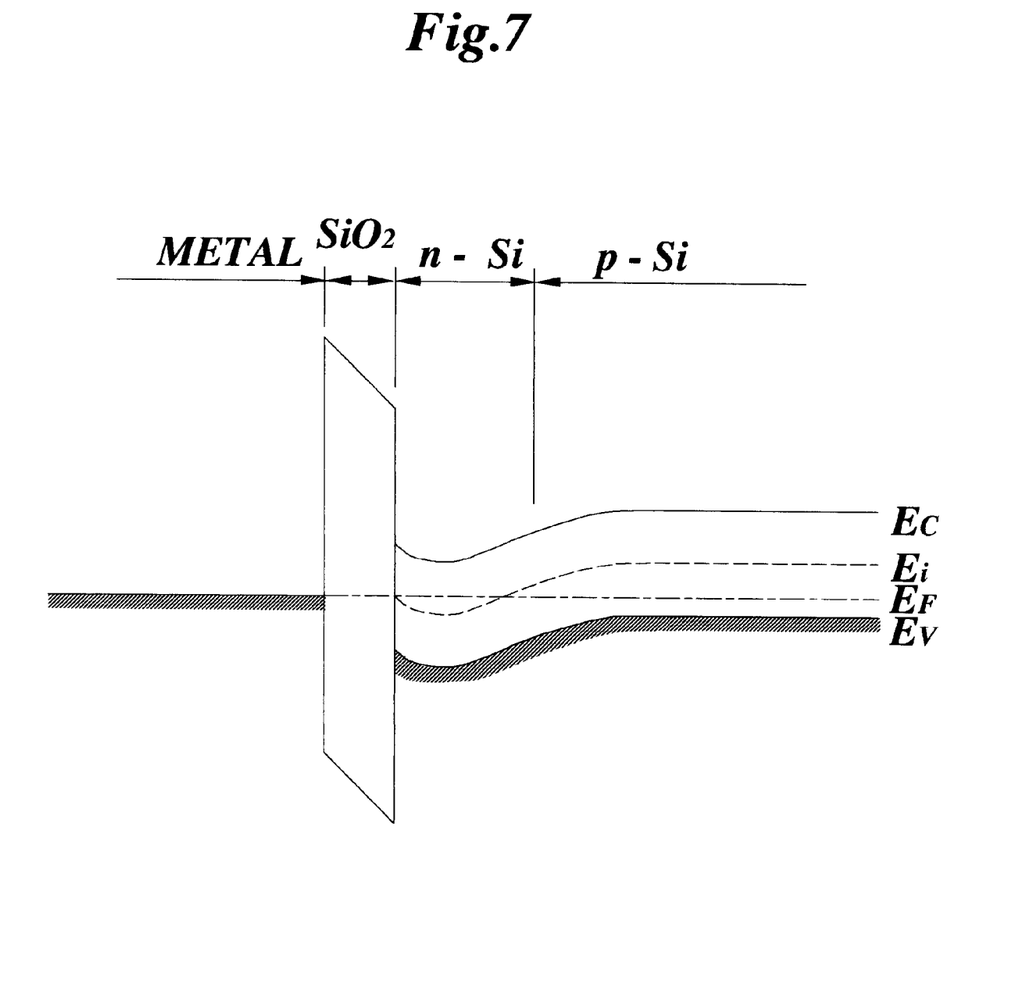
FIG. 7 shows a band gap in a memory cell.

In FIG. 7, the floating gate electrode 11 of the NAND-type EEPROM of the embodiment is made from gate electrode material that has a Fermi level $E_F$ at substantially the center of the band gap of a silicon semiconductor. When the n-type semiconductor region 27 is formed at the channel region of each memory cell 1, the threshold voltage of the memory cell 1 approaches a depletion-type threshold voltage. Accordingly, properly selecting the gate electrode material helps prepare enhancement-type and depletion-type threshold voltages. The gate electrode material may be refractory metal such as W, Ti, Mo, and Co, or silicide that is a compound of refractory metal and silicon.

Figure 8:
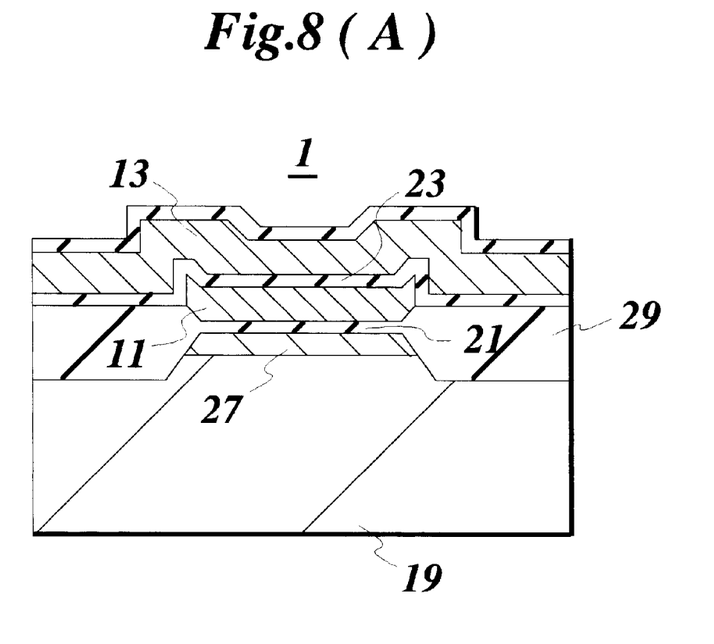
FIG. 8(A) is a sectional view showing a memory cell with an element isolation region.
FIG. 8(B) is a sectional view showing a memory cell with an isolating trench structure.

To realize high integration and large capacity, the NAND-type EEPROM of the embodiment may employ an isolating trench structure serving as an element isolation region. Although the trench structure involves the problem of soft-writing, the semiconductor region 27 of the present invention solves the problem. FIG. 8(A) shows an element isolation region 29 having a LOCOS (local oxidation of silicon) isolation structure, and FIG. 8(B) shows an element isolation region 31 employing the isolating trench structure. The element isolation region 29 of the LOCOS isolation structure is made of a silicon oxide film formed by thermal oxidation. The element isolation region 29 has a bird's beak that helps gently change a boundary between the element isolation region 29 and a channel region, and therefore, the channel region hardly causes electric field concentration. On the other hand, the element isolation region 31 of the trench structure has a trench 31A made from the surface of a p-type well region 19 in the depth direction and insulating material 31B such as a silicon oxide film filled in the trench 31A. The trench 31A is formed by anisotropic etching such as RIE (reactive ion etching) that causes less side etching. Accordingly, an upper corner (a dotted circle "a" in FIG. 8(B)) of the trench 31A that faces an edge of the channel region has a protruding shape to easily cause electric field concentration. The n-type semiconductor region 27 of the embodiment reduces the strength of an electric field at the surface of the channel region, to thereby prevent electric field concentration at the upper corner of the trench 31A. Namely, the present invention prevents soft-writing in a information read operation, the soft-writing being caused by electrons that are gradually injected from the channel region into a floating gate electrode 11.

Next, manufacturing processes of the NAND-type EEPROM of the present invention will be explained.

Figure 9:
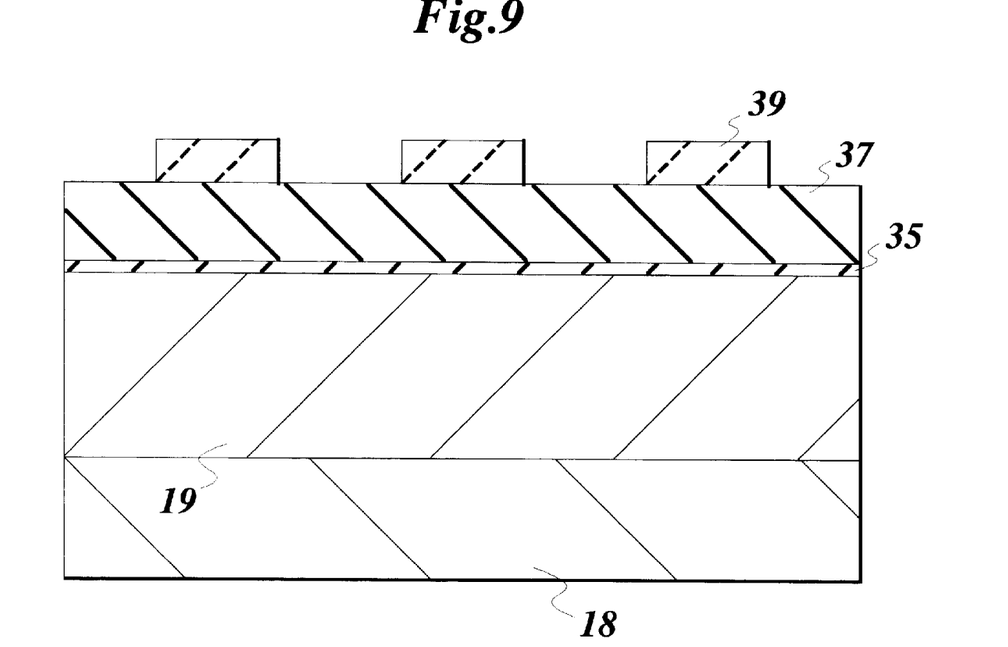
FIGS. 9 to 15 are sectional views showing a sequence of manufacturing processes of an EEPROM according to the present invention.

In FIG. 9, a p-type well region 19 is formed at the surface of an n-type semiconductor substrate 18. On the surface of the p-type well region 19, a silicon oxide buffer film 35, a silicon nitride film 37, and a resist film 39 are sequentially formed. An impurity concentration at the surface of the p-type well region 19 is about $10^{16}$ to $10^{18}$ atoms/cm$^3$. The silicon oxide buffer film 35 is, for example, 10 nm thick, and the silicon nitride film 37 is, for example, 200 nm thick. The resist film 39 is used to form a floating gate electrode 11 and has an opening to define the width of the gate. The resist film 39 is formed by, for example, photolithography.

Figure 10:
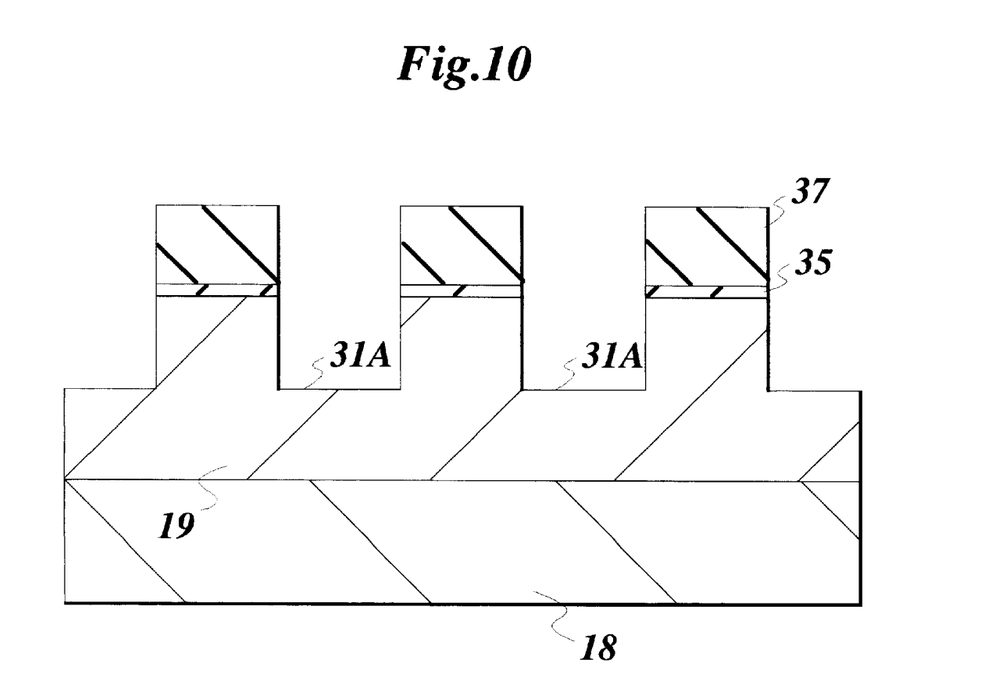

In FIG. 10, the resist film 39 is used as an etching mask to remove the silicon nitride film 37 and silicon oxide buffer film 35 by etching, thereby exposing the surface of the p-type well region 19. The etching is anisotropic etching based on RIE. The resist film 39 is removed, and the silicon nitride film 37 is used as an etching mask to partly remove the surface of the p-type well region 19 by etching, to form a trench 31A of an element isolation region 31 of an isolating trench structure. The etching is the anisotropic etching based on RIE. The depth of the trench 31A is about 0.4 μm.

Figure 11:
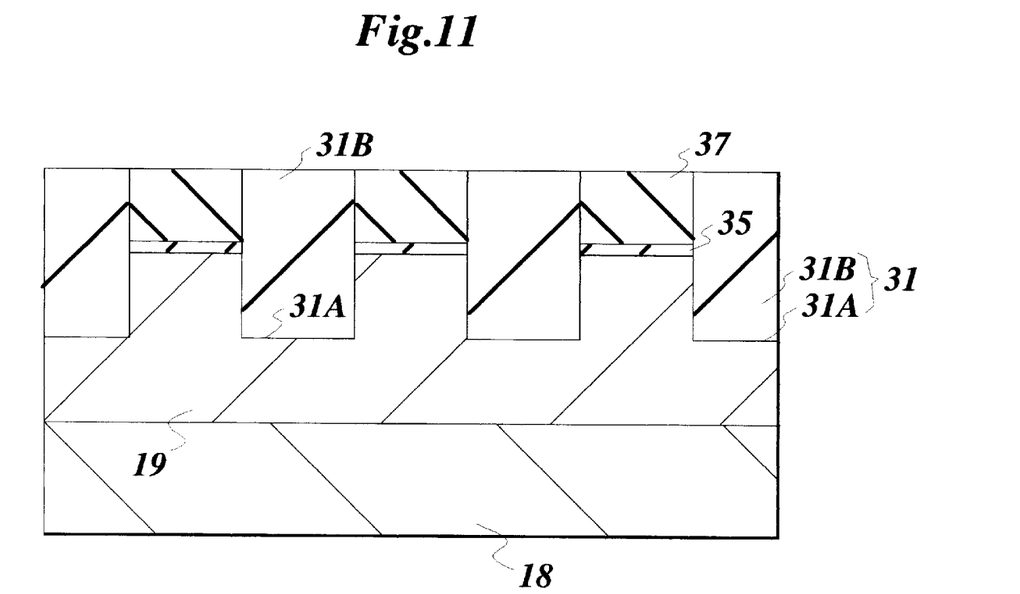

In FIG. 11, the trench 31A is filled with insulating material 31B, to complete the element isolation region 31 of the trench structure. The insulating material 31B is a silicon oxide film deposited inside the trench 31A by CVD (chemical vapor deposition). Excessively deposited part of the silicon oxide film is removed by etching.

Figure 12:
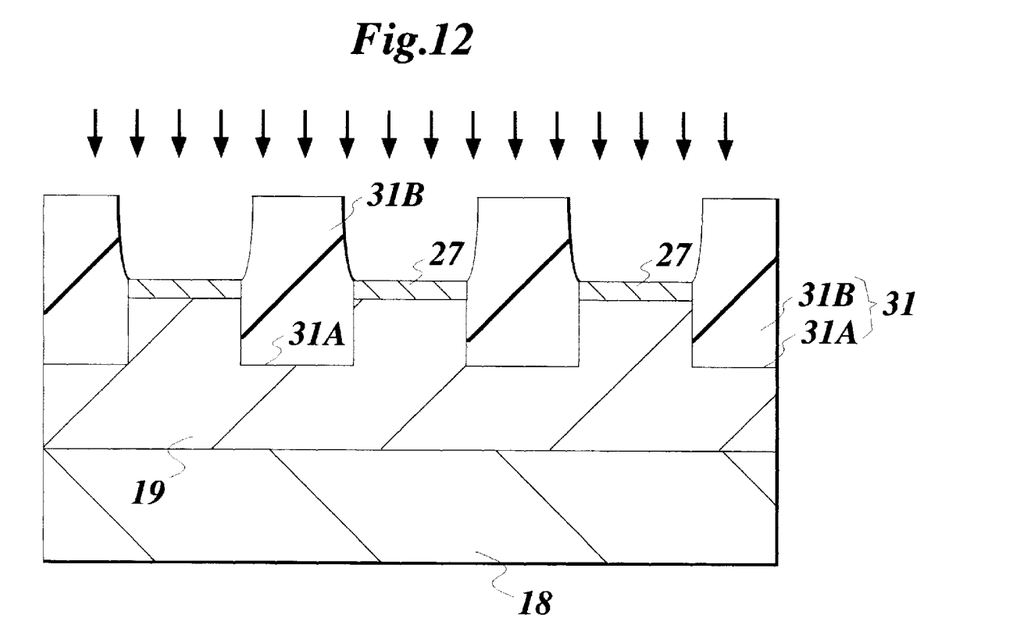

In FIG. 12, CDE (chemical dry etching) is employed to selectively etch the silicon nitride film 37. At this time, the surface of the insulating material 31B is slightly etched. The silicon oxide buffer film 35 is removed. To prevent damage of the surface of the p-type well region 19 due to ion implantation, a silicon oxide dummy film (not shown) is formed to about 10 to 30 nm thick. Through the silicon oxide dummy film, n-type impurities and p-type impurities are implanted into a channel region on the surface of the p-type well region 19. The n-type impurities form an n-type semiconductor region 27 to reduce the strength of an electric field at the surface of the channel region. The p-type impurities adjust a threshold voltage. The n-type impurities are arsenic (As) ions that are implanted at an acceleration voltage of 30 keV and a dose of $5\times10^{11}$ atoms/cm$^2$. As shown in FIG. 1(C), a peak of the concentration of the impurities in the n-type semiconductor region 27 is in the range of about 10 nm from the surface of the p-type well region 19. The position of the impurity concentration peak is adjustable not only by adjusting the acceleration voltage but also by adjusting the thickness of the silicon oxide dummy film. The p-type impurities are boron (B) ions that are implanted at an acceleration voltage of 50 keV and a dose of $5\times10^{12}$ atoms/cm$^2$. Thereafter, the silicon oxide dummy film is removed.

Figure 13:
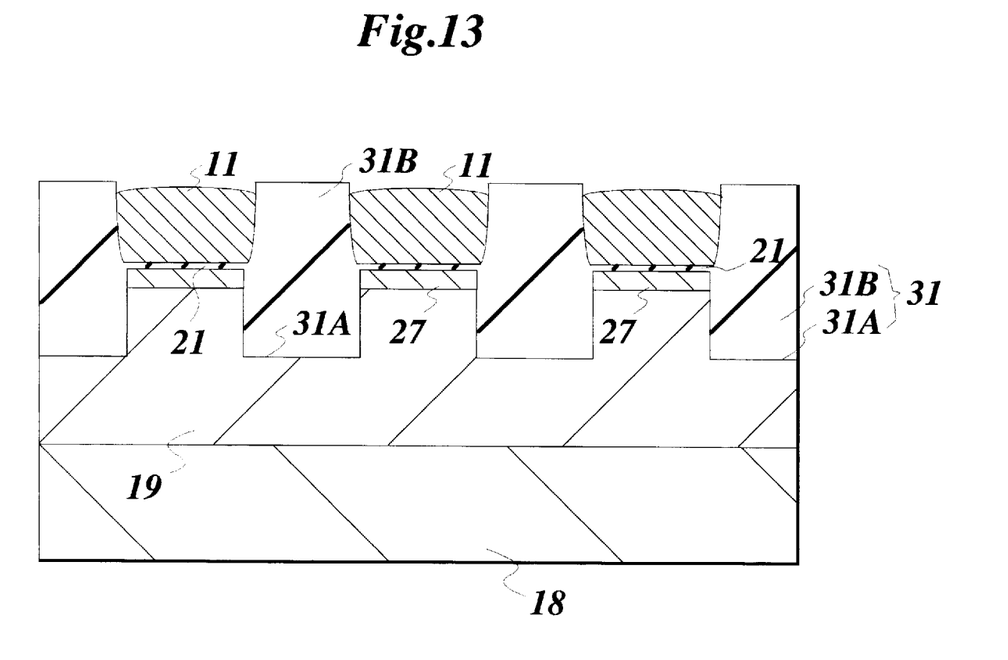

In FIG. 13, the surface of the p-type well region 19 serving as the channel region is washed, and on the washed surface, a tunnel insulation film 21 is formed. The tunnel insulation film 21 is a silicon oxide film formed by thermal oxidation to a thickness of, for example, 9 nm. On the tunnel insulation film 21, a floating gate electrode 11 is formed. The floating gate electrode 11 is deposited by CVD completely inside a slit of the insulating material 31B. Excessive part is removed by anisotropic etching based on RIE so that the floating gate electrode 11 is completely inside the slit. The floating gate electrode 11 may be formed of a polycrystalline silicon film. Preferably, it is formed from gate electrode material such as W having a Fermi level $E_F$ substantially at the center of the band gap of a silicon semiconductor.

Figure 14:
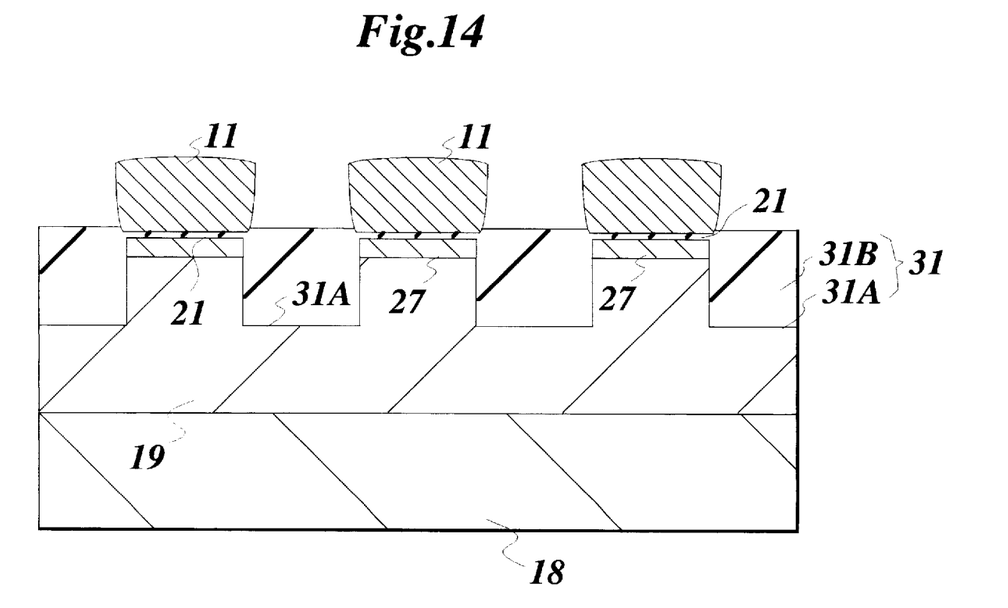

In FIG. 14, dilute NH$_4$F is used as etching solution to carry out isotropic etching to remove excessive part of the insulating material 31B approximately up to an interface between the floating gate electrode 11 and the tunnel insulation film 21.

Figure 15:
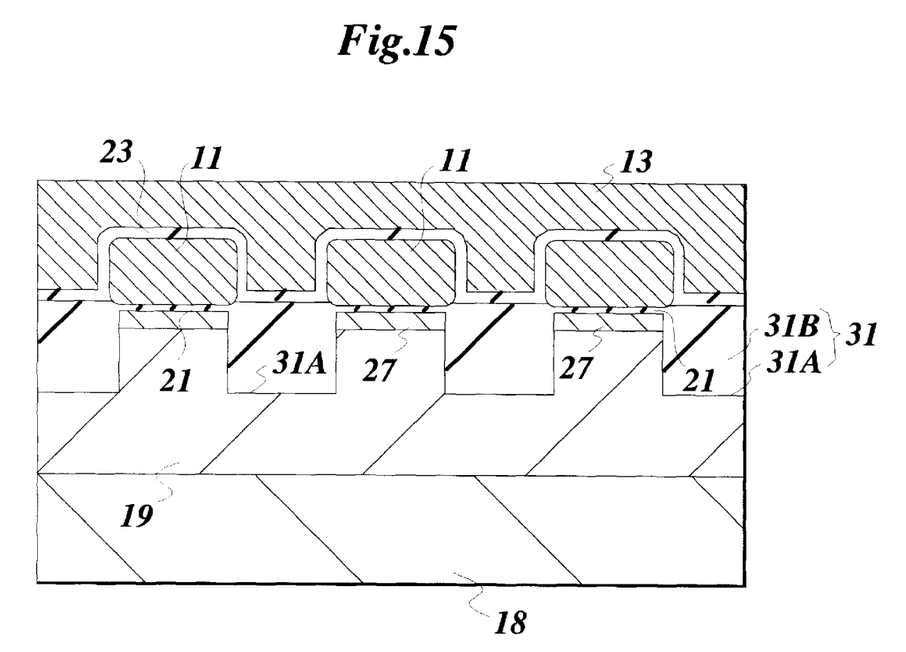

In FIG. 15, a gate insulation film 23 is formed on the floating gate electrode 11, and on the gate insulation film 23, a control gate electrode 13 and a word line integral with the control gate electrode 13 are formed. The control gate electrode 13 and word line are deposited by CVD, spattering, etc., and are patterned by anisotropic etching based on RIE. The patterning is carried out not only for the control gate electrode 13 and word line but also for the length of the floating gate electrode 11. Namely, the control gate electrode 13 and floating gate electrode 11 are cut together. The control gate electrode 13 may be a polycrystalline silicon film, a polycide film made of a polycrystalline silicon film laminated with a silicide film, a silicide film, or a refractory metal film.

Source and drain regions 15 and 17 (not shown) are formed in a self-aligning manner with respect to the control gate electrode 13, to complete insulated-gate FETs, i.e., memory cells 1. The source and drain regions 15 and 17 are formed by implanting n-type impurities. The n-type impurities may be As ions that are implanted at an acceleration voltage of 30 keV and a dose of $10^{14}$ to $10^{15}$ atoms/cm$^2$ that is higher than that of the n-type semiconductor region 27.

Lastly, an allover protective film is formed by CVD in a usual manner. Contact holes and wiring including bit lines 7 are formed, to complete the NAND-type EEPROM of the present invention.

Various modifications will become possible for those skilled in the art after receiving the teachings of the present disclosure without departing from the scope thereof. For example, the present invention is applicable to an EEPROM having memory cells 1 each having a p-channel insulated-gate FET. In this case, the surface of a channel region of each memory cell 1 is provided with a p-type semiconductor region to reduce the strength of an electric field at the surface of the channel region.

The present invention is not limited to the NAND-type EEPROMs. It is also applicable to NOR-type EEPROMs having memory cells that are connected in parallel. The present invention is not limited to memory cells each having a floating gate electrode. It is applicable to EEPROMs having memory cells each having an MNOS structure that employs, as an information storage part, an interface between a silicon oxide film and a silicon nitride film. The present invention is also applicable to EPROMs. The present invention is also applicable to a semiconductor integrated circuit device having EEPROMs or EPROMs.

As explained above, the present invention provides a nonvolatile semiconductor memory capable of reducing the strength of an electric field at the surface of a channel region of each memory cell, to reduce variations in the threshold voltages of the memory cells even if the thicknesses of tunnel insulation films and impurity concentrations vary from memory cell to memory cell. This results in preventing read errors and improving the reliability of the memory.

The present invention forms an element isolation region having an isolating trench structure without causing electric field concentration at corners of the trench. This prevents soft-writing in an information read operation, thereby improving the reliability, integration, and capacity of the nonvolatile semiconductor memory.

What is claimed is:

1. A nonvolatile semiconductor memory having a plurality of memory cells, each memory cell comprising:

an insulated-gate field effect transistor that stores information in an informative storage part according to a charge injected from a channel region into the information storage part through a tunnel insulation film;

an element isolation region including a trench formed at the surface of a substrate and filled with an insulation material; and a semiconductor region formed at the surface of the channel region and at corners of the trench, and having the same conductivity type as a channel conductivity type.

2. The nonvolatile semiconductor memory of claim 1, wherein the concentration of impurities in the semiconductor region has a peak at the surface of the channel region.

3. The nonvolatile semiconductor memory of claim 2, wherein a space charge in the semiconductor region is set to be equal to a space charge in a well region or a semiconductor substrate where the insulated-gate field effect transistor is formed.

4. The nonvolatile semiconductor memory of claim 3, wherein the space charge in the well region or semiconductor substrate is determined by an electron charge quantity, the concentration of impurities in the well region or semiconductor substrate, and the maximum width of a depletion layer in the well region or semiconductor substrate.

5. The nonvolatile semiconductor memory of claim 4, wherein the diffusion depth of the semiconductor region is set to be equal to the maximum width of the depletion layer that determines the space charge in the semiconductor region.

6. The nonvolatile semiconductor memory of claim 3, wherein the space charge in the semiconductor region is determined by an electron charge quantity, the concentration of impurities in the semiconductor region, and the maximum width of a depletion layer in the semiconductor region.

7. The nonvolatile semiconductor memory of claim 1, wherein the semiconductor region makes zero of the effective strength of an electric field at the surface of the channel region in an information read operation of the memory cell.

8. The nonvolatile semiconductor memory of claim 1, wherein:

the insulated-gate field effect transistor includes floating gate electrode and a control gate electrode; and the floating gate electrode serves as the information storage part.

9. The nonvolatile semiconductor memory of claim 1, wherein:

the insulated-gate field effect transistor is of an n-channel type; and the semiconductor region is of an n-type.

10. The nonvolatile semiconductor memory of claim 9, wherein the n-type semiconductor region has a lower impurity concentration than the source and drain regions of the insulated-gate field effect transistor.

11. The nonvolatile semiconductor memory of claim 1, wherein:

the insulated-gate field effect transistor is of a p-channel type; and the semiconductor region is of a p-type.

12. The nonvolatile semiconductor memory of claim 11, wherein the p-type semiconductor region has a lower impurity concentration than the source and drain regions of the insulated-gate field effect transistor.

13. The nonvolatile semiconductor memory of claim 1, wherein the memory cells are electrically connected in series to form a NAND-type nonvolatile semiconductor memory.

14. The nonvolatile semiconductor memory of claim 13, wherein:

the channel region of the insulated-gate field effect transistor is formed at the surface of a silicon semiconductor substrate; and the information storage part, which is a floating gate electrode, is made of gate electrode material that has a Fermi level at substantially the center of a band gap of the silicon semiconductor.

15. The nonvolatile semiconductor memory of claim 14, wherein the gate electrode material is refractory metal or silicide that is a compound of refractory metal and silicon.

16. The nonvolatile semiconductor memory of claim 15, wherein the refractory metal is one of W, Ti, Mo, and Co.

17. The nonvolatile semiconductor memory of claim 1, wherein:

the channel region of the insulated-gate field effect transistor is formed at the surface of a silicon semiconductor substrate; and the information storage part, which is a floating gate electrode, is made of gate electrode material that has a Fermi level at substantially the center of a band gap of the silicon semiconductor.

18. The nonvolatile semiconductor memory of claim 17, wherein the gate electrode material is refractory metal or silicide that is a compound of refractory metal and silicon.

19. The nonvolatile semiconductor memory of claim 18, wherein the refractory metal is one of W, Ti, Mo, and Co.

20. The nonvolatile semiconductor memory of claim 1, wherein each of the memory cells is capable of storing one of at least two values in the information storage part, to form a multivalued nonvolatile semiconductor memory.

21. A semiconductor integrated circuit device comprising the nonvolatile semiconductor memory of claim 1.

22. A nonvolatile semiconductor memory having a plurality of memory cells, each memory cell comprising an insulated-gate field effect transistor that stores information in an information storage part according to a charge injected from a channel region into the information storage part through a tunnel insulation film;

an element isolation region including a trench formed at the surface of a substrate and filled with an insulation material; and a semiconductor region formed at the surface of the channel region and at corners of the trench, having the same conductivity type as a channel conductivity, and functioning to reduce the strength of an electric field at the surface of the channel region and to reduce electric field concentration in the channel region at the corners of the trench.

* * * * *